US012125773B2

(12) United States Patent  
Hien et al.

(10) Patent No.: US 12,125,773 B2  
(45) Date of Patent: Oct. 22, 2024

(54) LEAD FRAME ASSEMBLY, METHOD FOR PRODUCING A PLURALITY OF COMPONENTS, AND COMPONENT

(71) Applicant: OSRAM Opto Semiconductors GmbH, Regensburg (DE)

(72) Inventors: Matthias Hien, Kirchroth (DE); Michael Zitzlsperger, Regensburg (DE)

(73) Assignee: OSRAM Opto Semiconductors GmbH, Regensburg (DE)

(*) Notice: Subject to any disclaimer, the term of this patent is extended or adjusted under 35 U.S.C. 154(b) by 366 days.

(21) Appl. No.: 17/629,038

(22) PCT Filed: Jul. 14, 2020

(86) PCT No.: PCT/EP2020/069876  
§ 371 (c)(1),  
(2) Date: Jan. 21, 2022

(87) PCT Pub. No.: WO2021/018566  
PCT Pub. Date: Feb. 4, 2021

(65) Prior Publication Data  
US 2022/0278028 A1  Sep. 1, 2022

(30) Foreign Application Priority Data  
Jul. 30, 2019  (DE) ...................... 10 2019 120 523.9

(51) Int. Cl.  
*H01L 23/48* (2006.01)  
*H01L 21/56* (2006.01)  
(Continued)

(52) U.S. Cl.  
CPC ...... *H01L 23/49541* (2013.01); *H01L 21/561* (2013.01); *H01L 23/3107* (2013.01)

(58) Field of Classification Search  
CPC ............. H01L 23/3107; H01L 2224/97; H01L 23/49548; H01L 23/49562; H01L 33/62  
(Continued)

(56) References Cited

U.S. PATENT DOCUMENTS

2010/0181628 A1* 7/2010 Kawano ................. H01L 24/85  
257/692  
2011/0308851 A1  12/2011 Tsou  
2017/0033055 A1  2/2017 Watanabe

FOREIGN PATENT DOCUMENTS

DE  102013000911 A1  4/2014  
EP  2779257 A2  9/2014  
(Continued)

OTHER PUBLICATIONS

International Search Report for International Patent Application No. PCT/EP2020/069876, mailed Nov. 12, 2020 (6 pages).

*Primary Examiner* — Caleb E Henry  
*Assistant Examiner* — Dilinh P Nguyen  
(74) *Attorney, Agent, or Firm* — ARENTFOX SCHIFF LLP (57) ABSTRACT

The invention relates to a lead frame assembly comprising a plurality of regularly arranged lead frames, each of which is suitable for electrically contacting components, comprises at least two lead frame elements distanced laterally by a recess and which are provided as electrical connections of different polarity, and has at least one anchoring element, which is suitable for anchoring a housing body of the component, the lead frame elements being thinned, flat regions of the lead frame, and the at least one anchoring element protrudes from a plane of the lead frame elements in the form of a pillar, and a plurality of connection elements, which in each case connects two lead frame elements of adjacent lead frames to one another, the two (Continued)

connected lead frame elements being provided as terminals of different polarity.

13 Claims, 8 Drawing Sheets

(51) Int. Cl.
    *H01L 23/31* (2006.01)
    *H01L 23/495* (2006.01)
    *H01L 23/52* (2006.01)

(58) Field of Classification Search
    USPC .......................................................... 257/782
    See application file for complete search history.

(56) References Cited

FOREIGN PATENT DOCUMENTS

| | | |
|---|---|---|
| EP | 2833419 A1 | 2/2015 |
| EP | 3255667 A1 | 12/2017 |
| GB | 2538059 A | 11/2016 |
| WO | 2016150841 A1 | 9/2016 |

\* cited by examiner

LEAD FRAME ASSEMBLY, METHOD FOR PRODUCING A PLURALITY OF COMPONENTS, AND COMPONENT

This application is a 35 U.S.C. § 371 National Phase of PCT Application No. PCT/EP2020/069876, filed on Jul. 14, 2020, which claims priority to German Patent Application No. 10 2019 120 523.9, filed Jul. 30, 2019, the disclosures of each of which are hereby incorporated by reference herein in their entireties.

A lead frame assembly is specified, which is particularly suitable for producing a plurality of components. Preferably, the components are optoelectronic components, such as radiation-emitting or radiation-detecting components.

For example, optoelectronic components are known which have a so-called QFN (Quad Flat No Leads) package. Characteristic of these components is that their electrical terminals formed from lead frame elements of a lead frame do not extend beyond a plastic sheath or a housing body, but are integrated into surfaces of the housing body in a flat form.

Generally, the adhesion of the housing body to the lead frame elements is comparatively poor, so that anchoring structures are provided on the lead frame elements.

An effective design of the anchoring structures has usually resulted in a large space requirement, which in turn leads to large component dimensions. For example, in conventional components, semiconductor chips are mounted on unthinned lead frame elements, i.e. on the solid material of the lead frame. Structures provided for anchoring, such as undercuts, are then arranged outside a "footprint" of the semiconductor chips and give rise to relatively large lateral dimensions of the components.

It is not a simple matter to reduce the size of the component since the known structures no longer function in the appropriate way. In particular, when cutting out the lead frame assembly, parts of it are torn out of the plastic sheath since the standard anchoring structures are no longer sufficiently effective.

One object to be achieved in the present case is to specify a lead frame assembly which allows a reduction of the component size. Other objects to be achieved are to specify a method for producing a plurality of components, or a component with reduced component size.

These objects are achieved, inter alia, by a lead frame assembly, a method for producing a plurality of components, and a component having the features of the independent claims.

Advantageous developments of the lead frame assembly, the method for producing a plurality of components, and the component are the subject of the dependent claims.

According to at least one embodiment of the lead frame assembly, it comprises a plurality of lead frames which are arranged in a regular pattern, as well as a plurality of connecting elements between the lead frames. A regular arrangement here refers to a recurring arrangement pattern. For example, the lead frames can be arranged in rows and columns. The lead frames are each preferably suitable for electrically contacting components and each have at least two lead frame elements that are laterally spaced apart by a cutout and provided as electrical terminals of different polarity. Furthermore, the lead frames advantageously have at least one anchoring element which is suitable for anchoring a housing body of the component. In particular, the lead frame elements are thin, flat regions of the lead frame, wherein the at least one anchoring element protrudes from a plane of the lead frame elements in the shape of a pillar. The at least one anchoring element can have an elliptical, in particular circular, shape at least in places, as viewed from the upper side of the lead frame assembly. The at least one anchoring element can be arranged on one of the lead frame elements of the lead frame.

Furthermore, the connecting elements each connect together two lead frame elements of, in particular directly, adjacent lead frames, the two connected lead frame elements being provided as terminals of different polarity. In other words, a lead frame element provided as an anode of a first lead frame and a lead frame element provided as a cathode of a second, in particular directly adjacent lead frame, are connected to each other by a connecting element. The connecting elements are also advantageously suitable as anchoring elements.

In a preferred design, each lead frame element of a lead frame is connected to a single lead frame element of a directly adjacent lead frame by exactly one connecting element, with the connected lead frame elements being provided as terminals of different polarity. The lead frames are therefore short-circuited in the lead frame assembly.

According to at least one embodiment, the lead frames are arranged in rows and columns, wherein each two, preferably directly adjacent columns, are twisted relative to each other, so that in the case of two lead frames of a row arranged next to each other, lead frame elements that are provided as terminals of different polarity are arranged directly next to each other. In particular, two directly adjacent columns are twisted by 180° relative to each other.

Preferably, the lead frame element provided as an electrical terminal of a first polarity, for example as a cathode, is a chip mounting region, while the lead frame element provided as an electrical terminal of a second polarity, for example as an anode, is a connecting means region. The at least one anchoring element can be provided on the connecting means region. It is advantageous that the anchoring element is provided for mounting an electrical connecting means, for example a planar conductor (so-called "planar interconnect"). In addition to the anchoring function, the anchoring element thus functions as a terminal element, which increases the integration density and reduces the component size.

In an advantageous embodiment of the lead frame assembly, the lead frames each have a plurality of anchoring elements which are arranged on different lead frame elements. In this case, an anchoring element can be arranged both on the lead frame element provided as an electrical terminal of the first polarity, for example as a cathode, and on the lead frame element provided as an electrical terminal of the second polarity, for example as an anode.

According to at least one embodiment, the at least one anchoring element extends laterally beyond the lead frame element as far as the cutout. Here, "laterally" refers to at least one direction that runs parallel to or in a main extension plane of the lead frame. In such a design, the anchoring element can be undergirded by a material of the housing body arranged in the cutout, thus achieving a better anchoring of the housing body in the lead frame. For example, the anchoring element may have a concave curved surface on its underside, so that a recess is formed that can be filled with material from the housing body. In particular, this allows the lead frame from becoming detached in the vertical direction, that is, perpendicular to the main extension plane.

In an advantageous design, the cutout which laterally spaces apart the at least two lead frame elements is elongated. This means in particular that a first lateral extent is smaller than a second lateral extent. The first lateral extent is advantageously specified along a column of lead frames, while the second lateral extent is specified along a row of lead frames. Preferably, the cutouts of adjacent lead frames of a row are designed continuously, i.e. without interruption, in pairs. The cutouts can be arranged offset relative to each other in steps. In particular, this results in a "Z" shape.

According to at least one embodiment, the lead frame assembly has a plurality of recesses, at least one connecting element being arranged between each two adjacent recesses. Preferably, the recesses penetrate the lead frame assembly completely in the vertical direction. In particular, the lead frame assembly has a plurality of first recesses arranged in columns, with at least one connecting element being arranged between each two adjacent first cutouts of a column. In addition, the lead frame assembly can have second recesses arranged in rows, with at least one connecting element being arranged between each two adjacent second recesses of a row. The shape and size of the connecting elements are determined by the shape and size of the recesses. In particular, these are chosen in such a way that the connecting elements are as small as possible while still guaranteeing sufficient stability during processing. For example, the recesses can be cross-shaped. Alternatively, the recesses can have a pentagonal shape or a different shape, in particular a geometric one.

In a preferred design, the anchoring elements and the connecting elements correspond to each other in their lateral extents, i.e. they have an at least approximately equal lateral extent or area. This has a favorable effect on the stability in the separation process. For example, the lateral extents in two perpendicular lateral directions can be between 50 μm and 200 μm, with deviations of ±10% within the tolerance range.

Furthermore, the anchoring elements can have a height, or vertical extent, which corresponds to a thickness of the unthinned lead frame or lead frame assembly. The thickness or vertical extent of the unthinned lead frame or lead frame assembly is in particular between 200 μm and 300 μm, with deviations of ±10% within the tolerance range. When using thinned semiconductor chips, the thickness may be less and may range from 50 μm to 200 μm inclusive, with deviations of ±10% within the tolerance range.

It is also advantageous if the anchoring elements are not more than one lead frame thickness, preferably half a lead frame thickness, from an imaginary line connecting the recesses. This can reduce stress in the vertical direction during separation. In the separation process, the connecting line represents in particular a cutting line, for example a sawing trench.

According to at least one embodiment of a method for producing a plurality of components, a lead frame assembly as described above is initially provided.

Preferably, a lead frame base body is provided during the production of the lead frame assembly. The lead frame base body is made of an electrically conductive material which also has good thermal conductivity. In particular, the lead frame base body is a metallic base body without a lead frame structure. A suitable material for the lead frame base body is copper, for example.

The lead frame base body is thinned in some regions, i.e. a thickness of the lead frame base body is reduced and anchoring elements are formed from it. In particular, the lead frame base body is thinned by an etching process, for example wet chemical etching. Furthermore, it is conceivable to structure the lead frame base body by stamping and punching.

The lead frame base body preferably has a thickness or vertical extent between 200 μm and 300 μm inclusive or, if thinned semiconductor chips are used, between 50 μm and 200 μm inclusive, with deviations of ±10% within the tolerance range. In the thinning, the thickness of the lead frame base body is reduced by at least one third. Preferably, in regions where lead frame elements are formed, the lead frame base body is thinned to the extent that it corresponds to a height of a semiconductor chip to be mounted, so that the semiconductor chip in the finished component essentially does not protrude beyond the top of the lead frame or component. In areas where connecting elements are formed, the lead frame base body can also be thinned. The anchoring elements, on the other hand, are not thinned, at least at some points. Accordingly, the anchoring elements can have a maximum height equal to the thickness of the unthinned lead frame base body.

In the lead frame base body, regularly arranged recesses are created, with connecting elements and lead frames being formed between the recesses. In particular, the recesses extend completely through the lead frame base body. The shape and size of the recesses are chosen depending on the desired size of the component, among other things. For example, the recesses can be cross-shaped and have a maximum lateral extent between 100 μm and 500 μm.

The connecting elements can be formed very narrow and reach lateral extents of between 70 μm and 200 μm inclusive, with deviations of ±10% within the tolerance range.

Furthermore, cutouts are generated that sub-divide, in particular sever, the lead frames laterally in such a way that one lead frame has a plurality of lead frame elements.

In an advantageous design of a method for producing the lead frame assembly, first recesses arranged in columns are generated, at least one connecting element being formed between each two adjacent first recesses of a column. In addition, second recesses arranged in rows are generated, wherein a connecting element is formed between each two adjacent second recesses of a row. In addition, a lead frame is formed between the intersection points of each two directly adjacent columns and rows. Preferably, the first and second recesses are formed identically in terms of their shape and size. However, it is also possible that the first recesses differ from the second recesses in terms of their shape and/or size.

The recesses and cutouts can be produced by an etching process, in particular by wet-chemical etching.

According to at least one embodiment of a method for producing a plurality of components, after the production or the provision of the lead frame assembly, the assembly of semiconductor chips on a lead frame element of each lead frame takes place. For example, the semiconductor chips can be attached to the respective lead frame element with a bonding agent or a soldering agent.

Furthermore, a casing can be produced after assembly, with the semiconductor chips and the lead frame assembly being partially embedded in the casing. The casing is preferably an injection molding compound applied by means of an injection molding process. Plastics such as silicones or epoxy resins are particularly suitable as a base material for the casing. The casing can also contain radiation-absorbing and/or reflective additives. The casing forms the housing body of the component in the finished component.

After the casing has been produced, it is separated into a plurality of components. This involves severing the connecting elements. In particular, the separation takes place by means of a sawing process. Preferably, the separation is carried out along imaginary connecting lines which run between the recesses of a column and row in each case.

In a preferred embodiment of the method, surfaces of the lead frame assembly arranged on an upper and lower side remain uncovered by the casing. This can be achieved in particular by covering the upper and lower sides of the lead frame during the production of the casing by the inner surfaces of a mold used for the production of the covering, which press on these surfaces. Anchoring elements or their surfaces, which are specifically provided for producing the casing, can act as attack surfaces for the forces exerted on the upper and lower sides by the inner surfaces. The resulting pressure can also prevent the lead frame assembly from floating up through the casing or injection molding compound, so that the lead frame assembly remains in its intended position.

The only partial embedding of the anchoring elements in the casing or the exposure of the anchoring elements on the upper and lower sides helps to prevent parts of the lead frame assembly from being torn out of the casing during the separation process. The anchoring elements have an advantageous effect both vertically and laterally in all directions.

According to at least one embodiment of a component, it comprises a lead frame and at least one semiconductor chip arranged on the lead frame, as well as a housing body in which the at least one semiconductor chip and the lead frame are partially embedded. Preferably, the lead frame comprises at least two lead frame elements laterally spaced apart by a cutout, which are provided as electrical terminals of different polarity. The lead frame elements are preferably spatially separated and electrically isolated by the cutout. Furthermore, the lead frame advantageously has at least one anchoring element which is arranged on one of the lead frame elements. The semiconductor chip is arranged in particular on a lead frame element provided as an electrical terminal of a first polarity and connected by means of a connecting means to a lead frame element provided as an electrical terminal of a second polarity. In this arrangement, a first main surface of the at least one semiconductor chip and a first main surface of the at least one anchoring element form part of a first main surface of the component.

In particular, the first main surface of the component is flat. Accordingly, the first main surface of the semiconductor chip and the first main surface of the anchoring element are also flat and lie in the same plane as the first main surface of the component. The first main surface of the semiconductor chip and the anchoring element are each arranged on their sides facing away from the lead frame elements.

In a preferred embodiment, the first main surfaces of the semiconductor chip and the anchoring element are not covered by the housing body. Furthermore, the lead frame elements on a second main surface or underside of the component are preferably not covered by the housing body. This means the component can be electrically connected on the underside and is therefore surface-mountable. Particularly preferably, the lead frame elements do not protrude beyond the housing body in lateral directions. Furthermore, the lead frame elements on the side surfaces of the component preferably terminate flush with the housing body.

According to at least one embodiment, the semiconductor chip is arranged on a chip mounting surface of the lead frame element, with the anchoring element and the chip mounting surface being arranged on the same side of the lead frame. In particular, the anchoring element protrudes beyond the chip mounting surface of the lead frame element.

Preferably, the connecting means is electrically connected by means of the anchoring element to the lead frame element provided as an electrical terminal of a second polarity. In particular, the connecting means is a planar electrical conductor, a so-called "planar interconnect", which runs in a flat course between the semiconductor chip and the anchoring element on the housing body.

As already mentioned above, the at least one anchoring element can extend laterally beyond the lead frame element as far as the cutout. In particular, the anchor element has a prism-like, cylindrical, pyramidal frustum or conical frustum shape. It is also possible that a side surface which borders the anchoring element laterally has a straight cross-section or is curved at least in some places. For example, the cross section of the side surface may be concave.

The semiconductor chip can be a radiation-emitting semiconductor chip such as a light-emitting diode chip or laser diode chip, or a radiation-detecting semiconductor chip such as a photodiode or phototransistor. In particular, the radiation-emitting semiconductor chip is suitable for the emission of electromagnetic radiation in the visible, ultraviolet, or infrared spectral range. Furthermore, the radiation-detecting semiconductor chip is preferably suitable for the detection of electromagnetic radiation in the visible, ultraviolet, or infrared spectral range. In addition, the semiconductor chip can be designed to detect chemicals, such as gases.

The component can comprise a plurality of semiconductor chips, which means it is a so-called "multi-chip" component. In this case, at least one of the semiconductor chips can be a radiation-emitting semiconductor chip and another semiconductor chip a radiation-detecting semiconductor chip. Such a component is particularly suitable for use as a reflective light barrier.

In an advantageous embodiment, the component has an integrated circuit (IC for short), which is particularly suitable for controlling the individual semiconductor chips in the case of a multi-chip component. The semiconductor chips can be interconnected by means of planar electrical conductors or by a combination of planar electrical conductors and bonding wires.

The above-described lead frame assembly as well as the above-described method are particularly suitable for producing a plurality of the components described here. The features described in connection with the component can therefore also be applied to the lead frame assembly and the method, and vice versa. Also, the features described in connection with the lead frame assembly can also be applied to the method and vice versa.

The component is particularly suitable for applications in the automotive and multimedia sectors as well as in the field of general lighting.

Further advantages, advantageous embodiments and further developments arise from the exemplary embodiments, described hereafter in connection with the figures.

In the exemplary embodiments and figures, identical, similar or equivalently functioning elements can each be labelled with the same reference signs. The elements illustrated and their proportions are not necessarily to be regarded as true to scale; rather, individual elements can be represented in exaggerated size for better illustration and/or comprehension.

In the first exemplary embodiment shown in FIGS. 1 to 8, the lead frame assembly 1 comprises a plurality of lead frames 5 and a plurality of connecting elements 3 which are arranged between the lead frames 5. The lead frames 5 are regularly arranged along columns A and rows B in the lead frame assembly 1. Each lead frame 5 comprises two lead frame elements 6, 7 spaced apart laterally by a recess 2 and which are provided as electrical terminals of different polarity. In addition, each lead frame 5 has two anchoring elements 8, each suitable for anchoring a casing or a housing body.

Figure 1:
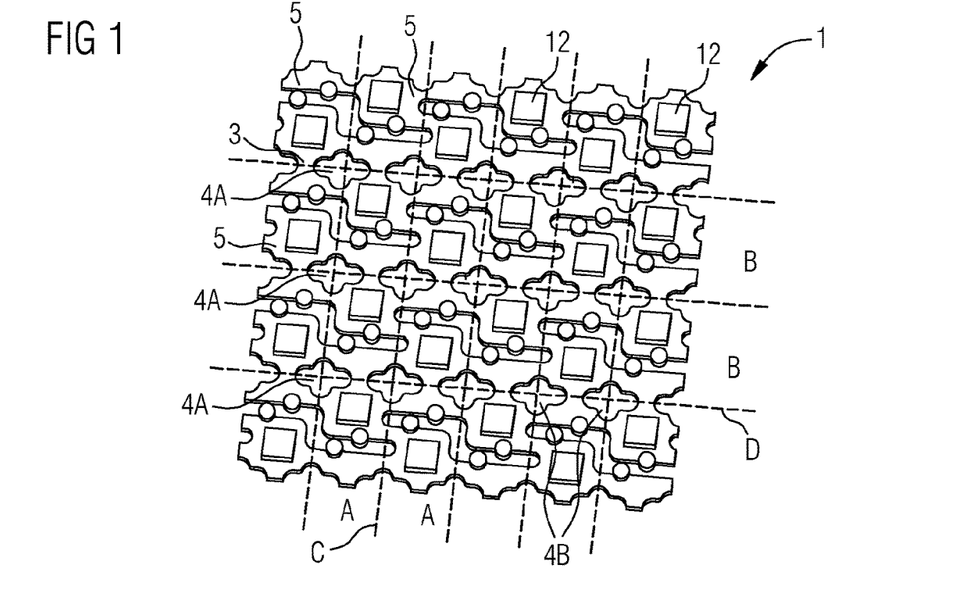
FIG. 1 shows a schematic perspective view of a lead frame assembly or an intermediate stage of a method for producing a plurality of components according to a first exemplary embodiment.
Figure 2:
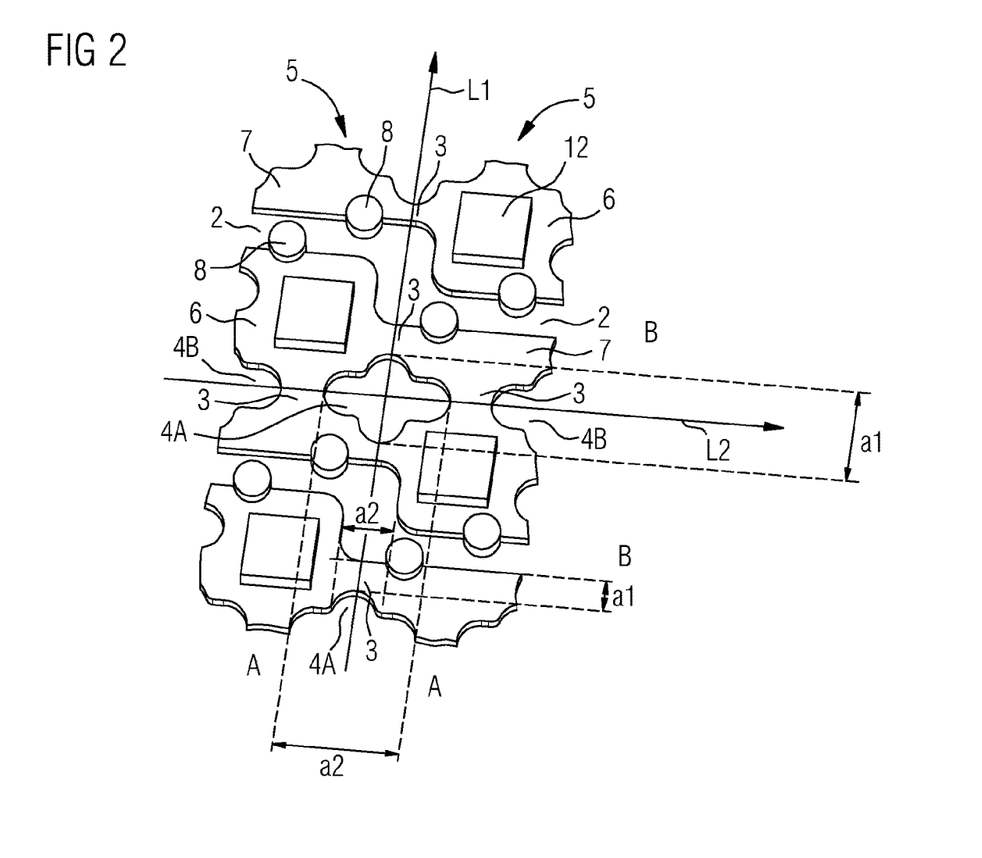
FIG. 2 shows a detail of the lead frame assembly or intermediate stage shown in FIG. 1, FIGS. 3 and 4 show schematic views of sections of a lead frame assembly or intermediate stage according to the first exemplary embodiment.

The connecting elements 3 each connect two lead frame elements 6, 7 of adjacent lead frames 5 to each other, the two connected lead frame elements 6, 7 being provided as terminals of different polarity. In particular, each lead frame element 6, 7 of a lead frame 5 is connected to a single lead frame element 6, 7 of a directly adjacent lead frame 5 by exactly one connecting element 3, wherein the connected lead frame elements 6, 7 are provided as terminals of different polarity. The lead frames 5 are thus short-circuited in the lead frame assembly 1.

In addition, two directly adjacent columns A are twisted relative to each other by 180° in a plan view of the lead frame assembly 1, so that in the case of two lead frames 5 of a row B arranged next to each other, lead frame elements 6, 7, which are provided as terminals of different polarity, are arranged directly next to each other.

For example, the lead frame element 6 provided as an electrical terminal of a first polarity, for example a cathode, is a chip mounting region, while the lead frame element 7 provided as an electrical terminal of a second polarity, for example an anode, is a connecting means region.

As is clear in particular from FIG. 2, the lead frame assembly 1 has a plurality of first recesses 4A arranged along the columns A, wherein two connecting elements 3 are arranged between each two adjacent recesses 4A of a column A. Furthermore, the lead frame assembly 1 has a plurality of second recesses 4B arranged in rows B, wherein a connecting element 3 is arranged between each two adjacent second recesses 4B of a row B. The shape and size of the connecting elements 3 are determined by the shape and size of the recesses 4A, 4B. In particular, these are chosen in such a way that the connecting elements 3 are as small as possible while still guaranteeing sufficient stability during processing. For example, the recesses 4A, 4B can be cross-shaped. Their lateral extent a1, a2 in two mutually perpendicular lateral directions L1, L2 is preferably between 100 µm and 500 µm in each case. In addition, the lateral extents a1, a2 of the connecting elements 3 are preferably between 70 µm and 200 µm inclusive, with deviations of ±10% within the tolerance range.

Figure 3:
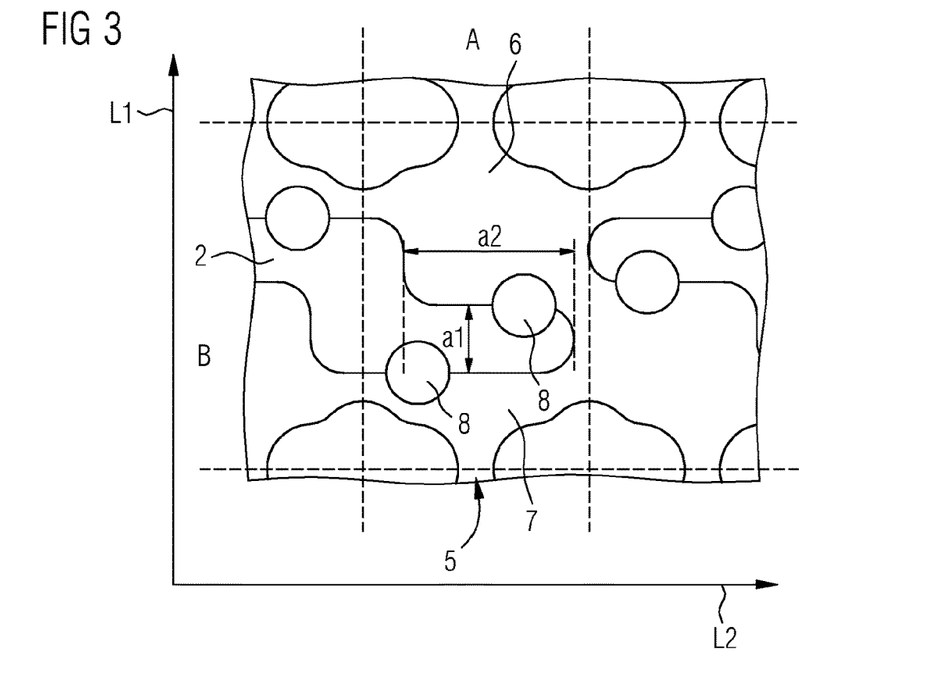
Figure 4:
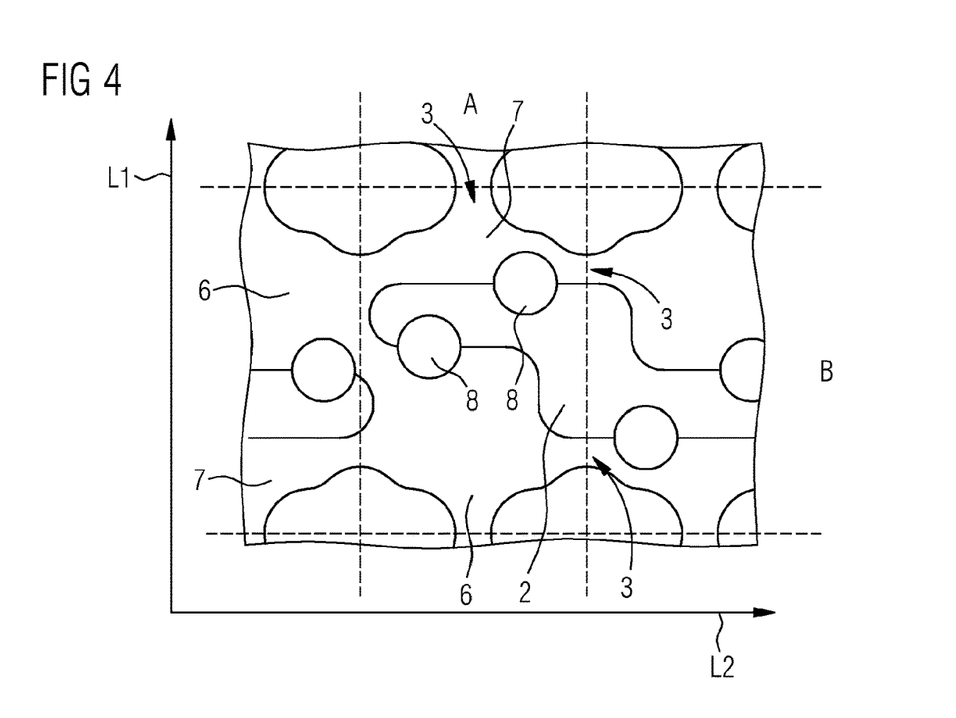
Figure 5:
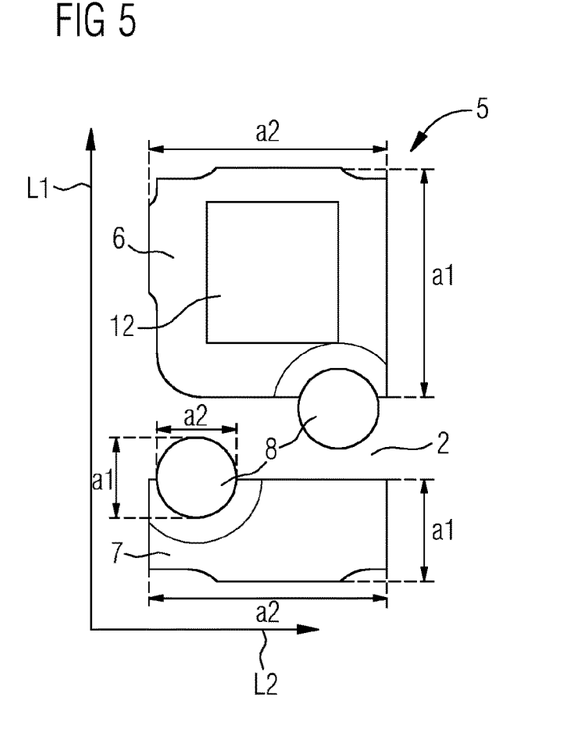
FIGS. 5 to 8 show different views of a lead frame according to a first exemplary embodiment or a detail of the lead frame assembly according to the first exemplary embodiment.
Figure 6:
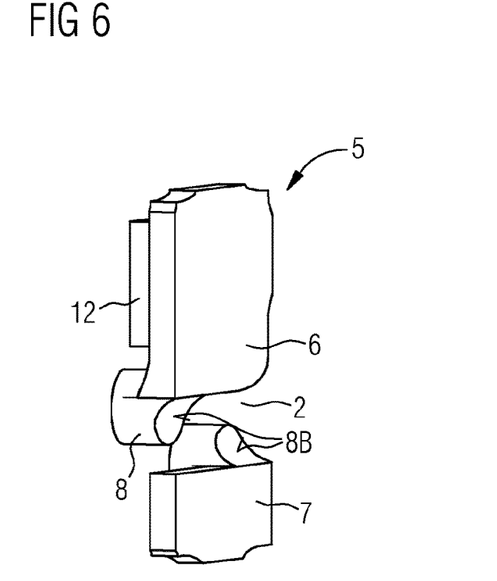
Figure 7:
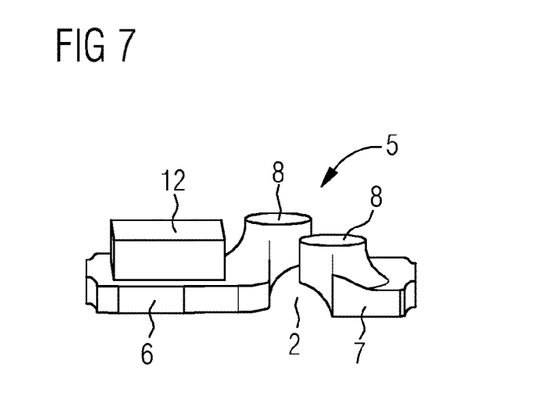
Figure 8:
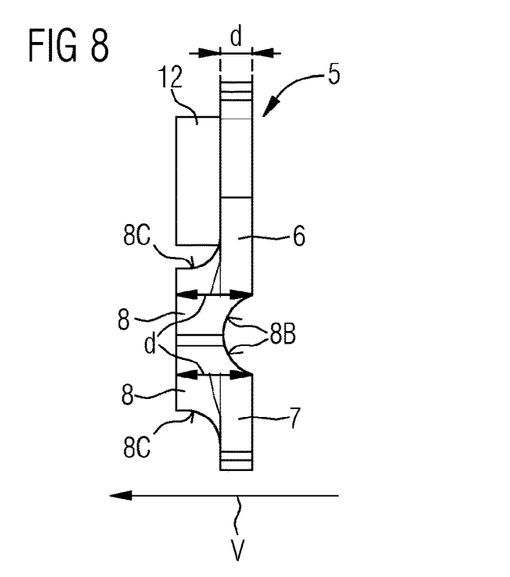

In conjunction with FIGS. 3 and 4, the cutouts 2 will now be discussed in more detail. The lead frame elements 6, 7 of a lead frame 5 are each separated by a cutout 2 in a first lateral direction L1. The cutouts 2 are elongated and have a shorter extent along the first lateral direction L1 than along a second lateral direction L2. For example, the shorter lateral extent a1 may be between 70 µm and 150 µm inclusive, while the longer lateral extent a2 may be at least 100 µm, with deviations of ±10% within the tolerance range.

The cutouts 2 of directly adjacent lead frames 5 of a row B are formed in pairs continuously, i.e. without interruptions. The cutouts 2 are arranged offset relative to each other in steps, in particular forming the shape of a "Z".

In conjunction with FIGS. 5 to 8, the lead frame 5 and its elements 6, 7 and 8 will now be discussed in more detail. The lead frame elements 6, 7 are thinned, flat areas of the lead frame 5. For example, the lead frame elements 6, 7 can have a thickness or vertical extent d between 70 µm and 150 µm inclusive, with deviations of ±10% within the tolerance range.

Furthermore, the lead frame element 6, provided as a chip mounting region, can be at least approximately rectangular in a plan view of the lead frame 5 and have a first and second lateral extent a1, a2, which are each between 300 µm and 500 µm inclusive, with deviations of ±10% within the tolerance range.

The lead frame element 7, provided as a connecting means region, can also be at least approximately rectangular in a plan view of the lead frame 5 and have a first and second lateral extent a1, a2, wherein the first lateral extent a1 is shorter than the second lateral extent a2. While the first lateral extent a1 is between 70 µm and 150 µm, the second lateral extent a2 can correspond to that of the other lead frame element 6 and range from 300 µm to 500 µm inclusive, with deviations of ±10% within the tolerance range.

The anchoring elements 8 are arranged diagonally opposite each other in a plan view of the lead frame 5. They protrude in each case in the vertical direction V beyond the lead frame elements 6, 7 in the form of a pillar and at least in some places have an elliptical, in particular circular, shape in a plan view of the top of the lead frame 5. Preferably, the lateral extents a1, a2 of the anchoring elements 8 are each between 50 µm and 200 µm inclusive, with deviations of ±10% within the tolerance range. In addition, the anchoring elements 8 can have a height d or vertical extent d which corresponds to a thickness of the unthinned lead frame 5 or lead frame assembly 1. This is in particular between 200 µm and 300 µm inclusive, with deviations of ±10% within the tolerance range.

In particular, the anchoring elements 8 are no more than one lead frame thickness, preferably half a lead frame thickness, away from a connecting line C (see FIG. 1) connecting the recesses 4A. This can reduce the stress in the vertical direction V during separation. In the separation process, the connecting line C represents a cutting line, for example a sawing trench.

FIGS. 1 to 9 can also be used to explain in more detail a first exemplary embodiment of a method for producing a plurality of components 100. Firstly, the lead frame assembly 1 is provided or produced, wherein a lead frame base body is provided and thinned in some regions, in particular using an etching process, so that the anchoring elements 8 are formed from it. Furthermore, the regularly arranged recesses 4A, 4B are generated, wherein the connecting elements 3 and lead frame 5 are formed between the recesses 4A, 4B. Furthermore, the cutouts 2 are generated, which sub-divide or sever the lead frames 5 laterally in such a way that a lead frame comprises a plurality of lead frame elements 6, 7.

In addition, a semiconductor chip 12 is mounted on a lead frame element 6 of each lead frame 5. Finally, a casing 11 is produced in which the semiconductor chips 12 and the lead frame assembly 1 are partially embedded. This is followed by a separation into a plurality of components 10, wherein the connecting elements 3 are severed.

Figure 9:
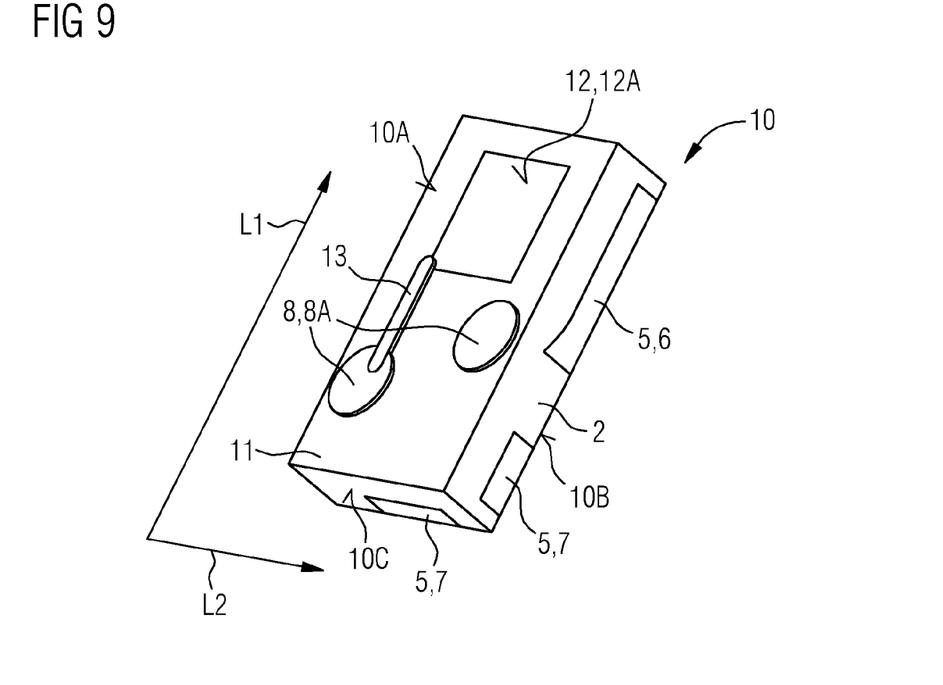
FIG. 9 shows a schematic perspective view of a component according to a first exemplary embodiment, which can be produced using a lead frame assembly or method according to the first exemplary embodiment.

A component 10 which can be produced in this way, which in particular has a cuboidal shape, is shown in FIG. 9.

The component 10 comprises a lead frame 5 which comprises two lead frame elements 6, 7 spaced apart laterally by a cutout 2 and provided as electrical terminals of different polarity. In addition, the lead frame 5 has two anchoring elements 8, which are arranged on the different lead frame elements 6, 7. The component 10 has a semiconductor chip 12 which is mounted on the lead frame element 6 provided as an electrical terminal of a first polarity and is connected to the lead frame element 7, provided as an electrical terminal of a second polarity, by means of a connecting device 13 arranged on the anchoring element 8.

The semiconductor chip 12 is, for example, a radiation-emitting semiconductor chip 12. In this case, the semiconductor chip 12 has a semiconductor body with an active zone which is suitable for generating radiation. In particular, the active zone is a p-n junction zone. The active zone can then be formed as one layer or as a layer sequence consisting of a plurality of layers.

For example, in the operation of the component 10 the active zone emits electromagnetic radiation, for example in the visible, ultraviolet, or infra-red spectral range.

For the layers of the semiconductor body, materials based on nitride or phosphide compound semiconductors are preferred. "Based on nitride compound semiconductors" in the present context means that at least one layer of the semiconductor body comprises a nitride III/V compound semiconductor material, preferably $Al_nGa_mIn_{1-n-m}N$, where $0 \le n \le 1$, $0 \le m \le 1$ and $n+m \le 1$. Accordingly, "based on phosphide compound semiconductors" means that at least one layer of the semiconductor body comprises $Al_nGa_mIn_{1-n-m}P$, where $0 \le n \le 1$, $0 \le m \le 1$ and $n+m \le 1$. This material does not necessarily have to have a mathematically exact composition according to the above formula. Rather, it may contain one or more dopants and additional components that do not substantially alter the characteristic physical properties of the $Al_nGa_mIn_{1-n-m}N$, or $Al_nGa_mIn_{1-n-m}P$ material. For the sake of simplicity, however, the above formula only contains the essential components of the crystal lattice (Al, Ga, In, N), even if these may be replaced in some cases by trace amounts of other substances.

Furthermore, the component 10 has a housing body 11 in which the semiconductor chip 12 and the lead frame 5 are partially embedded. The lead frame 5 and the semiconductor chip 12 are integrated into the surfaces of the housing body 11 as planar components, wherein a first main surface 12A of the semiconductor chip 12 and a first main surface 8A of the anchoring elements 8 each form part of a first main surface 10A of the component 10, and the lead frame elements 6, 7 on a second main surface 10B or underside of the component 10 are not covered by the housing body 11. Furthermore, the lead frame elements 6, do not protrude beyond the housing body 11 in lateral directions L1, L2, but terminate flush with the housing body 11 on side surfaces 10C of the component 10.

Furthermore, the housing body 11 is arranged in the cutout 2 and in regions of the lead frame elements 6, 7 which are laterally downstream of the anchoring elements 8 and the semiconductor chip 12. The anchoring elements 8 extend laterally beyond the lead frame elements 6, 7 as far as the cutout 2 and are undergirded by the housing body 11. For example, as can be seen from FIGS. 6 to 8, the anchor elements 8 can have a concave curved surface 8B on their lower sides, so that a recess is formed in each case in which material of the housing body 11 accumulates. Furthermore, one side surface 8C which borders the anchor elements 8 laterally can be concave in cross-section.

The connecting means 13 is a flat electrical conductor, a so-called "planar interconnect", which runs flat on the housing body 11 between the semiconductor chip 12 and the anchoring element 8.

The two lead frame elements 6, 7 are electrically isolated by means of the cutout 2. The component 10 can be electrically connected on the underside by means of the uncovered surfaces of the lead frame elements 6, 7 and is therefore surface-mountable.

The component 10, with a vertical extent of between 200 μm and 300 μm inclusive with deviations of ±10% within the tolerance range, and lateral extents a1 of between 600 μm and 1300 μm inclusive and a2 between 300 μm and 500 μm inclusive, with deviations of ±10% within the tolerance range, has a small component size but is nevertheless stable due to its anchoring elements 8. In particular, detachment of the housing body 11 can be prevented by the anchoring elements 8.

Figure 10:
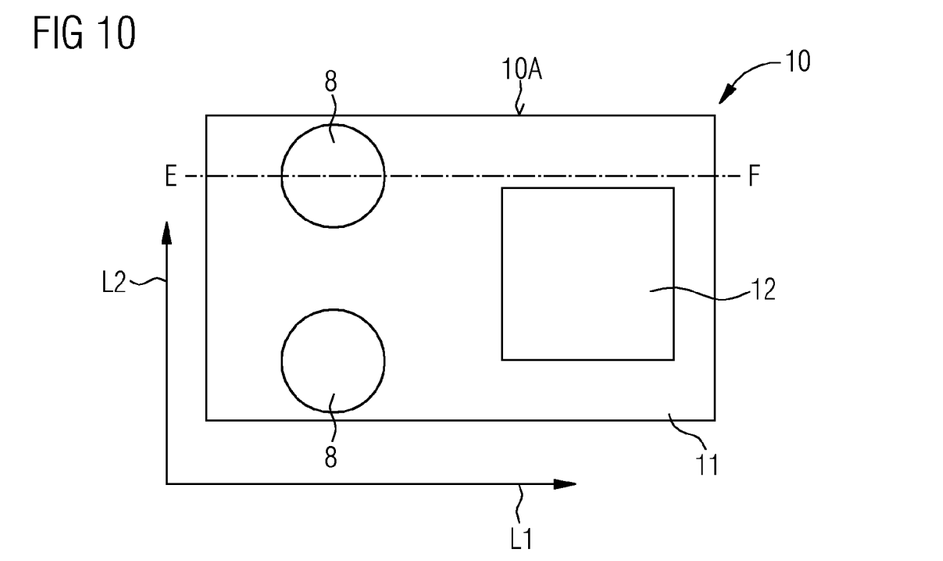
FIGS. 10 to 12 show different views of a component according to a second exemplary embodiment.

FIG. 10 shows a second exemplary embodiment of a component 10 in a plan view of the first main surface 10A of the component 10. In the plan view shown in FIG. 11, the housing body 11 is shown as transparent so that the lead frame 5 is visible. FIG. 12 shows a schematic cross-sectional view of the component 10 along the line E-F.

Figure 11:
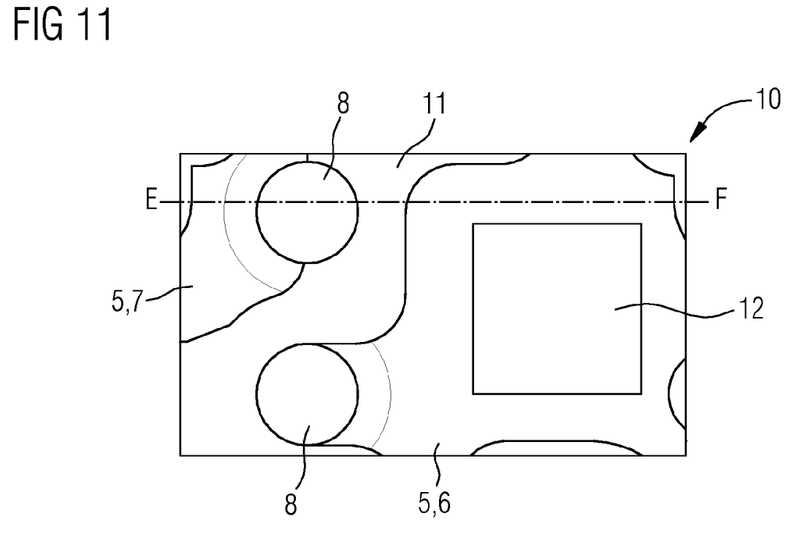
Figure 12:
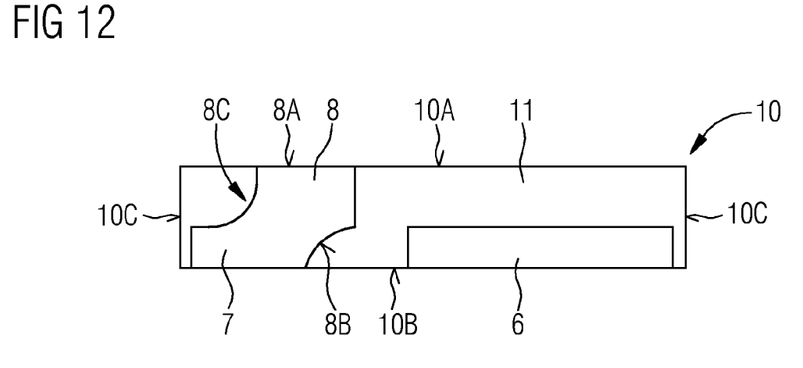

As can be seen from FIGS. 10 and 11, the two anchoring elements 8 are arranged offset relative to each other in the second lateral direction L2, but not in the first lateral direction L1. In contrast, in the exemplary embodiment shown in FIG. 9 the anchoring elements 8 are arranged offset relative to each other in both lateral directions L1, L2. The arrangement according to the second exemplary embodiment can be achieved by extending a section of the lead frame element 6 arranged on the anchoring element 8, while a region of the lead frame element 7 arranged opposite the extended region is cut out. Due to the greater lateral distance from the lead frame element 6 to the anchoring element 8, the chip mounting is less affected by the anchoring element 8 and its uneven side surface 8C. Reference is made to the first exemplary embodiment for the additional design features.

Figure 13:
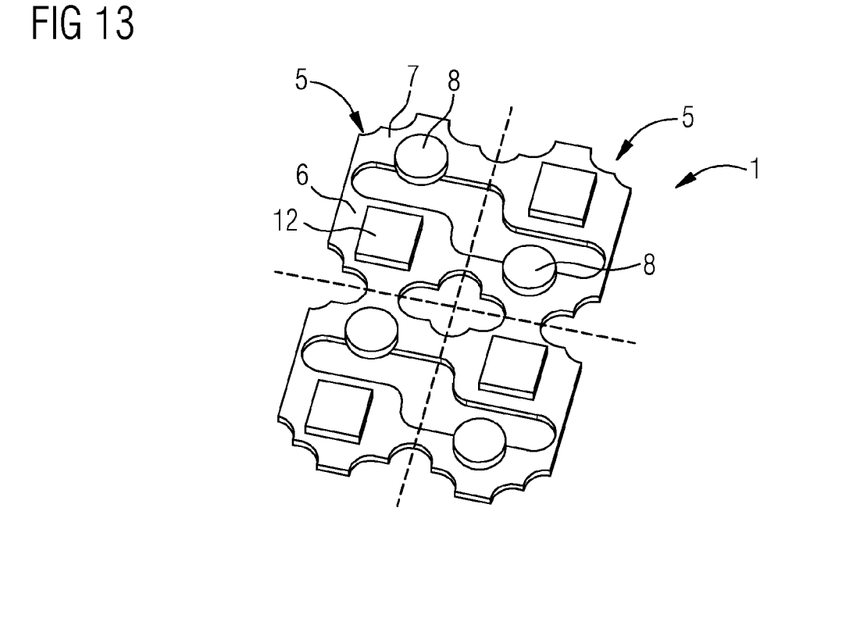
FIG. 13 shows a schematic perspective view of a lead frame assembly or an intermediate stage of a method for producing a plurality of components according to a third exemplary embodiment.

In the third exemplary embodiment shown in FIG. 13, the lead frames 5 each have only one anchoring element 8. The anchoring element 8 in this case is arranged opposite the semiconductor chip 12, on the lead frame element 7 provided as the connecting means region. Reference is made to the first exemplary embodiment for the additional design features.

Even with a component based on this exemplary embodiment, a small component size can be achieved and a sufficient stability can be obtained due to the anchoring element 8. In particular, detachment of the housing body can be prevented by the anchoring element.

In the fourth exemplary embodiment shown in FIGS. 14 to 17, the lead frames 5 each have four lead frame elements 6, 7A, 7B, 7C, wherein the lead frame element 6 is provided as a chip mounting region and the lead frame elements 7A, 7B, 7C as connecting means regions. While the lead frame elements 7A, 7B, 7C are rectangular in shape, the lead frame element 6 is triangular in shape.

Figure 14:
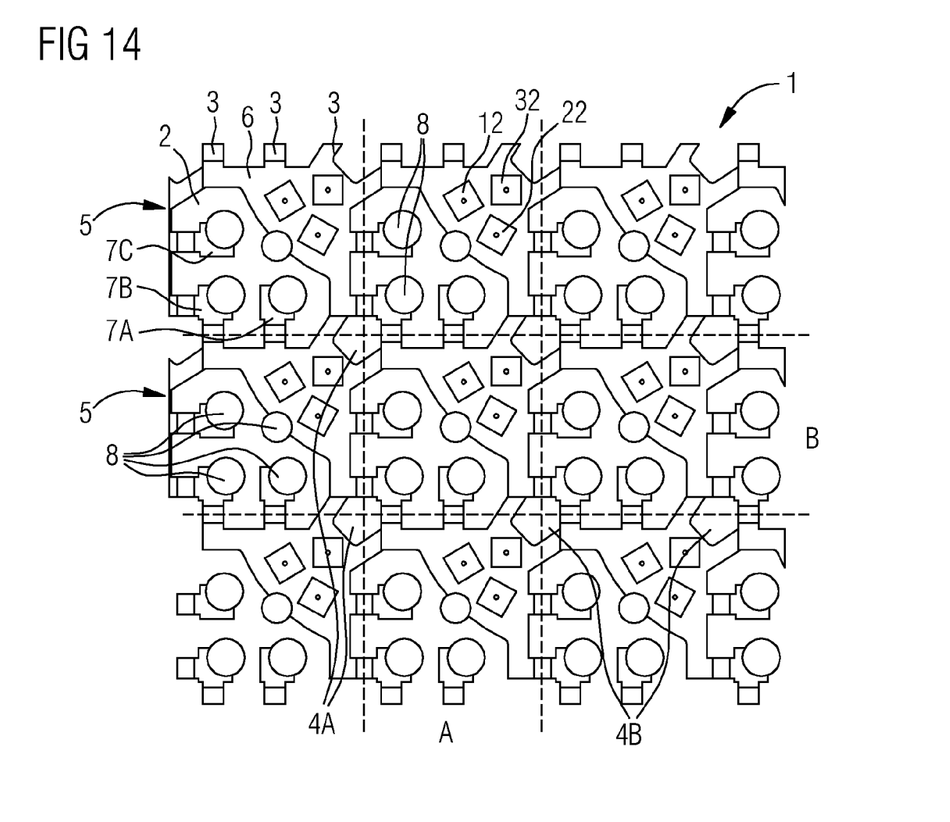
FIG. 14 shows a schematic perspective view of a lead frame assembly or an intermediate stage of a method for producing a plurality of components according to a fourth exemplary embodiment.
Figure 15:
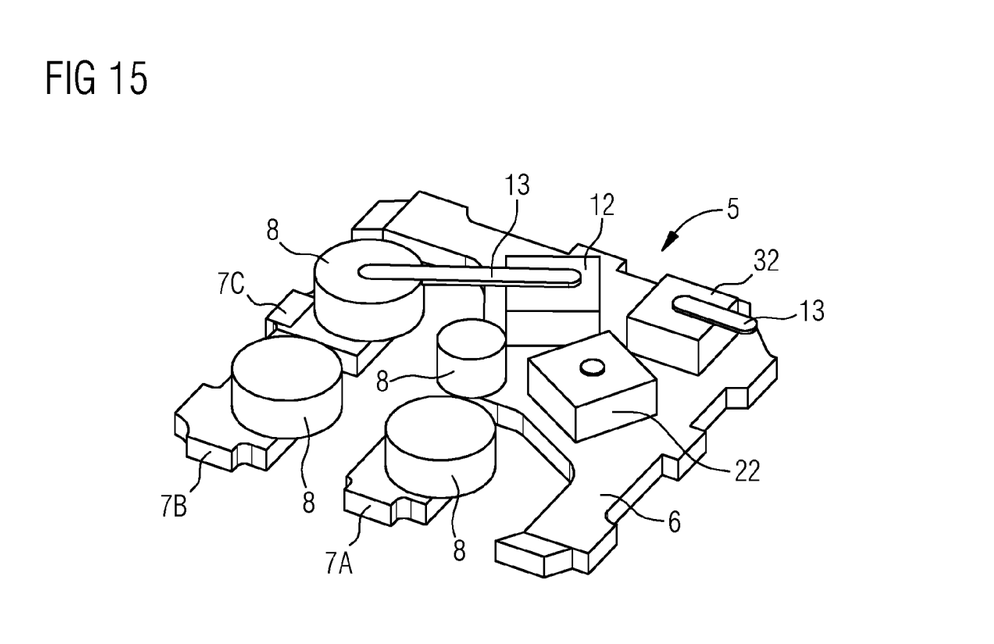
FIGS. 15 and 16 show different views of a lead frame or a detail of the lead frame assembly according to the fourth exemplary embodiment.

A first, second and third semiconductor chip 12, 22, 32, which are designed in particular for the emission of electromagnetic radiation of different wavelengths, are arranged on the lead frame element 6. For example, the first semiconductor chip 12 emits blue light in operation, the second semiconductor chip 22 emits green light in operation, and the third semiconductor chip 32 emits red light in operation. By mixing the red, green and blue light, the finished component 10 (see FIG. 17) can emit white light in operation. Alternatively, at least one of the semiconductor chips 12, 22, 32 can be a radiation-detecting semiconductor chip.

While the lead frame element 6 serves as a common electrical terminal of a first polarity, the other lead frame elements 7A, 7B, 7C are each assigned to a semiconductor chip 12, 22, 32 as an additional electrical terminal of a second polarity. The lead frame elements 6, 7A, 7B, 7C are laterally spaced apart or spatially separated by the cutout 2.

The lead frames 5 in the lead frame assembly 1 are connected to each other by connecting elements 3. Some of the connecting elements 3 connect two lead frame elements 6, 7A, 7B, 7C of adjacent lead frames 5 to each other, the two connected lead frame elements 6, 7A, 7B, 7C being provided as terminals of different polarity in each case.

An anchoring element 8 is arranged on each lead frame element 6, 7A, 7B, 7C of each lead frame 5. While the anchoring elements 8 arranged on the lead frame elements 7A, 7B, 7C are provided in particular for attaching a connecting means 13, the anchoring element 8 arranged on the lead frame element 6 can act as an attack surface for the forces exerted by the inner surfaces of an injection mold on the upper and lower sides of the lead frame assembly 1 during production. This anchoring element 8 may have smaller lateral extents than the other anchoring elements 8.

The lead frame assembly 1 has first recesses 4A arranged in columns A and second recesses 4B arranged in rows B, which are identical in shape and size. The shape used corresponds to a pentagon. Connecting lines connecting the recesses 4A of a column A, and connecting lines connecting the recesses 4B of a row B, are used as cutting lines in the separation process.

The finished component 10 (see FIGS. 16 and 17) comprises a lead frame 5, which comprises four lead frame elements 6, 7A, 7B, 7C laterally spaced apart by a cutout 2. In addition, the lead frame 5 has four anchoring elements 8, which are arranged on the various lead frame elements 6, 7A, 7B, 7C. The component 10 has a plurality of semiconductor chips 12, 22, 32, which are mounted on the lead frame element 6 provided as an electrical terminal of a first polarity and are each connected by means of a connecting means 13 to the lead frame element 7A, 7B, 7C, provided as an electrical terminal of a second polarity.

Figure 16:
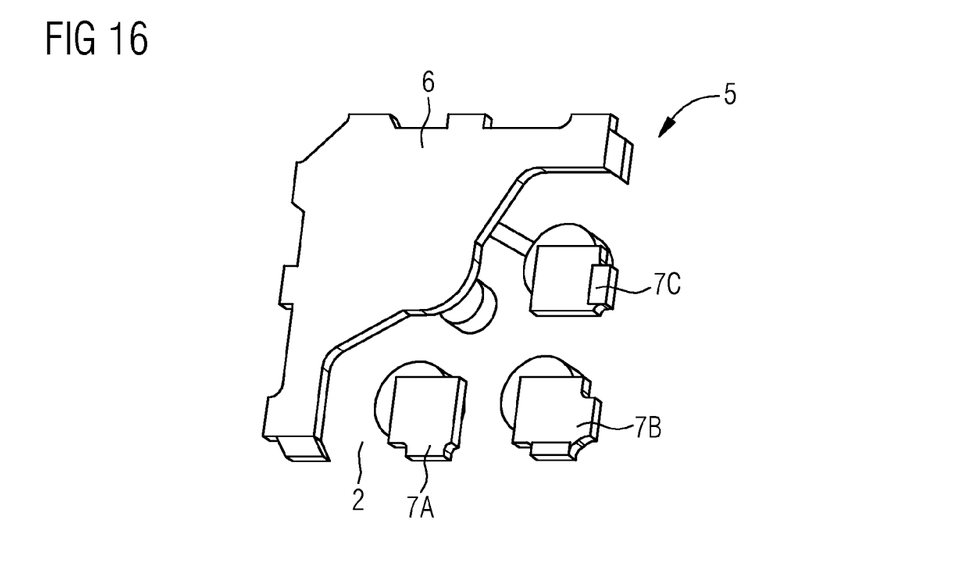
Figure 17:
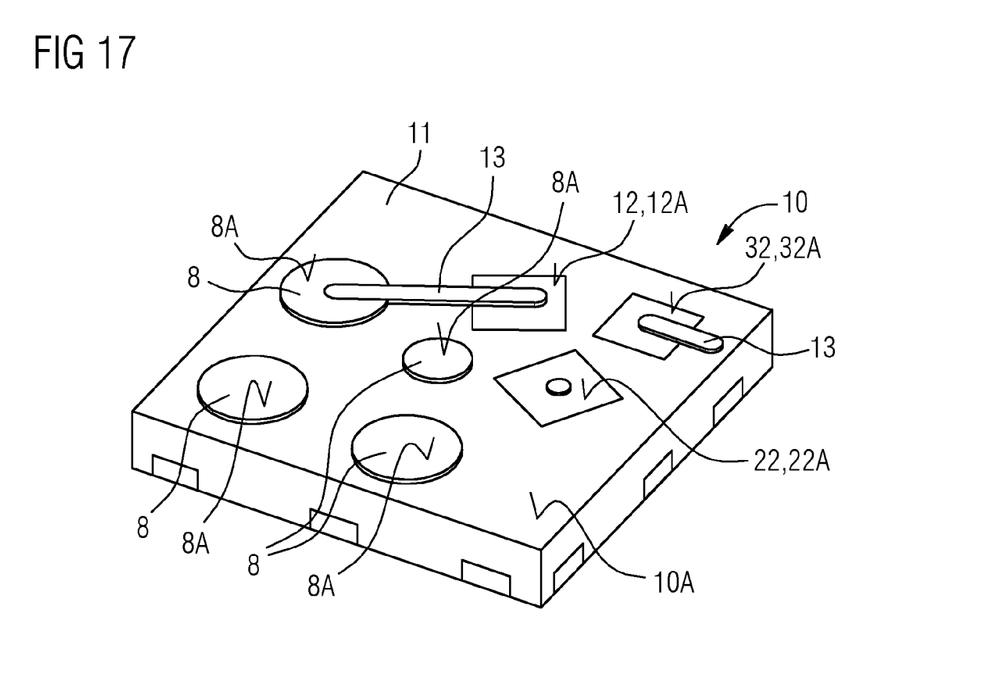
FIG. 17 shows a schematic perspective view of a component according to the fourth exemplary embodiment, which can be produced with a lead frame assembly or method according to the fourth exemplary embodiment.

Furthermore, the component 10 has a housing body 11, in which the semiconductor chips 12, 22, 32 and the lead frame 5 are partially embedded. The lead frame 5 and the semiconductor chips 12, 22, 32 are integrated into the surfaces of the housing body 11 as planar components, wherein a first main surface 12A, 22A, 32A of the semiconductor chips 12, 22, 32 and a first main surface 8A of the anchoring elements 8 form a part of a first main surface 10A of the component 10, and the lead frame elements 6, 7A, 7B, 7C on a second main surface or underside of the component 10 are not covered by the housing body 11. Furthermore, the lead frame elements 6, 7A, 7B, 7C do not protrude laterally beyond the housing body 11, but terminate flush with the housing body 11 on side surfaces of the component 10.

The lead frame elements 6, 7A, 7B, 7C are electrically isolated by means of the cutout 2. The component 10 can be electrically connected to the underside by means of the uncovered surfaces of the lead frame elements 6, 7A, 7B, 7C, wherein the different semiconductor chips 12, 22, 32 can be individually electrically controlled.

With regard to the other design features, for example the shape and size of the anchoring elements 8 or the dimensions of the lead frame elements 6, 7A, 7B, 7C and connecting elements 3, additional reference is made to the first exemplary embodiment.

The invention is not limited by the description based on the exemplary embodiments. Rather, the invention comprises each new feature, as well as any combination of features, which includes in particular every combination of features in the patent claims, even if this feature or this combination itself is not explicitly specified in the patent claims or exemplary embodiments.

This patent application claims the priority of the German patent application 102019120523.9, the disclosed content of which is hereby incorporated by reference.

LIST OF REFERENCE SIGNS 1 lead frame assembly
2 cutout
3 connecting element
4 recess
4A first recess
4B second recess
5 lead frame
6, 7, 7A, 7B, 7C lead frame element
8 anchoring element
8A first main surface
8B lower surface
8C side surface
9 sheath
10 component
10A first main surface
10B second main surface
10C side surface
11 housing body
12, 22, 32 semiconductor chip
12A, 22A, 32A first main surface
13 connecting means
a1, a2 lateral extent
d vertical extent
A column
B row
C, D connecting line
L1 first lateral direction
L2 second lateral direction
V vertical direction

The invention claimed is:

1. A lead frame assembly, comprising:
a plurality of regularly arranged lead frames, each of which
is suitable for electrically contacting components,
comprises at least two lead frame elements spaced apart laterally by a cutout and which are provided as electrical terminals of different polarity, and
has at least one anchoring element, which is suitable for anchoring a housing body of the component, the at least two lead frame elements being thinned, flat regions of the lead frame, and the at least one anchoring element protrudes from a plane of the at least two lead frame elements in a form of a pillar, wherein the at least one anchoring element extends laterally beyond the at least two lead frame elements as far as the cutout,
a plurality of connecting elements, which in each case connect two lead frame elements of adjacent lead frames to one another, the two lead frame elements of the adjacent lead frames being provided as terminals of different polarity.

2. The lead frame assembly as claimed in claim 1, wherein the lead frames are arranged in rows and columns and each two adjacent columns are twisted relative to each other, so that in the case of two lead frames in a row arranged next to each other, lead frame elements which are provided as terminals of different polarity are arranged directly next to each other.

3. The lead frame assembly as claimed in claim 1, wherein the at least one anchoring element is arranged on one of the at least two lead frame elements.

4. The lead frame assembly as claimed in claim 1, wherein the lead frames each have a plurality of anchoring elements which are arranged on different lead frame elements.

5. The lead frame assembly as claimed in claim 1, wherein respective cutouts of adjacent lead frames of a row are formed continuously in pairs.

6. The lead frame assembly as claimed in claim 1, wherein respective cutouts of two adjacent lead frames of a row are arranged offset relative to one another in steps.

7. The lead frame assembly as claimed in claim 1, wherein a first lead frame element provided as a first electrical terminal of a first polarity is a chip mounting region and a second lead frame element provided as a second electrical terminal of a second polarity is a connecting means region.

8. The lead frame assembly as claimed in claim 1, which has first recesses arranged in columns and second recesses arranged in rows, wherein at least one connecting element is arranged between each two adjacent first recesses of a column and at least one connecting element is arranged between each two adjacent second recesses of a row.

9. A method for producing a plurality of components, comprising:
providing a lead frame assembly according to claim 1,
mounting semiconductor chips on a lead frame element of each lead frame,
generating a casing in which the semiconductor chips and the lead frame assembly are partially embedded, and
separating into a plurality of components, wherein the plurality of connecting elements are severed.

10. The method as claimed in claim 9, wherein surfaces of the lead frame assembly arranged on an upper side and on a lower side remain uncovered by the casing.

11. A component, comprising:
a lead frame, which
comprises at least two lead frame elements spaced apart laterally by a cutout and which are provided as electrical terminals of different polarity, and
has at least one anchoring element arranged on one of the at least two lead frame elements, wherein the at least one anchoring element extends laterally beyond the one of the at least two lead frame elements as far as the cutout,
at least one semiconductor chip arranged on a first lead frame element provided as a first electrical terminal of a first polarity and connected by a connecting device to a second lead frame element provided as a second electrical terminal of a second polarity,
a housing body in which the at least one semiconductor chip and the lead frame are partially embedded, wherein
a first main surface of the at least one semiconductor chip and a first main surface of the at least one anchoring element each form part of a first main surface of the component.

12. The component as claimed in claim 11, wherein the at least two lead frame elements on a second main surface of the component are not covered by the housing body.

13. The component as claimed in claim 11, wherein the connecting device is electrically connected by the at least one anchoring element to the second lead frame element provided as the electrical terminal of the second polarity.

* * * * *